United States Patent
Lin et al.

(10) Patent No.: US 7,405,621 B2
(45) Date of Patent: Jul. 29, 2008

(54) APPARATUS FOR AMPLIFYING DIFFERENTIAL SIGNAL

(75) Inventors: Ying-Fu Lin, Taipei (TW); Yu-Tsun Chien, Yilan County (TW)

(73) Assignee: Industrial Technology Research Institute, Hsinchu (TW)

( * ) Notice: Subject to any disclaimer, the term of this patent is extended or adjusted under 35 U.S.C. 154(b) by 157 days.

(21) Appl. No.: 11/309,043

(22) Filed: Jun. 13, 2006

(65) Prior Publication Data

US 2007/0236288 A1    Oct. 11, 2007

(30) Foreign Application Priority Data

Apr. 7, 2006 (TW) .............................. 95112373 A

(51) Int. Cl.
*H03F 3/45* (2006.01)
*H03F 3/191* (2006.01)

(52) U.S. Cl. ........................ 330/254; 330/303; 330/305

(58) Field of Classification Search ................. 330/254, 330/303, 305
See application file for complete search history.

(56) References Cited

U.S. PATENT DOCUMENTS

| 6,480,067 | B1 | 11/2002 | Kobayashi et al. | .......... 330/279 |
| 6,670,847 | B1 | 12/2003 | Rokhsaz | ...................... 330/250 |
| 6,937,054 | B2 | 8/2005 | Hsu et al. | ...................... 326/30 |
| 2007/0115048 | A1* | 5/2007 | Mansuri et al. | ................. 330/9 |

* cited by examiner

*Primary Examiner*—Steven J Mottola
(74) *Attorney, Agent, or Firm*—Jianq Chyun IP Office

(57) ABSTRACT

An apparatus for amplifying differential signals is provided. The apparatus comprises a differential amplifier, a first impedance component, a second impedance component, a voltage source and a high-pass filter. The differential amplifier receives an input differential signal with a first terminal and a second terminal. The differential amplifier also drains currents from the voltage source into a third terminal and a fourth terminal via the first and the second impedance components respectively. The high-pass filter receives the input differential signal and outputs a control differential signal to control the first and the second impedance components so that the impedance of the first and the second impedance components vary inversely in response to the voltages at the first and the second terminals respectively when the state of the input differential signal changes.

7 Claims, 5 Drawing Sheets

APPARATUS FOR AMPLIFYING DIFFERENTIAL SIGNAL

CROSS-REFERENCE TO RELATED APPLICATION

This application claims the priority benefit of Taiwan application serial no. 95112373, filed on Apr. 7, 2006. All disclosure of the Taiwan application is incorporated herein by reference.

BACKGROUND OF THE INVENTION

1. Field of the Invention

The present invention relates to an apparatus for amplifying signals, more particularly, to an apparatus for amplifying differential signals.

2. Description of Related Art

In most conditions, the designer of a differential amplifier is eager to increase the frequency bandwidth of the differential amplifier. To increase the bandwidth, a few conventional techniques have been provided. One of the techniques is adding a zero point of the circuit, thereby canceling the original pole. However, the addition of a new zero will generate a new pole so that the design of the circuit becomes more complicated.

Another method is provided in U.S. Pat. No. 6,937,054. In this method, the conductive characteristic of a capacitor device at high frequency is used so that two sets of differential amplifiers are connected in parallel at high frequency to increase the high frequency gain and hence increases the bandwidth. Yet, this method has a number of defects. Because only one set of differential amplifier is in operation at a low frequency, the low frequency gain is sacrificed. Since two sets of amplifiers are connected in parallel at a high frequency, a bigger current is drawn and the capacitor loading at the output terminal is also heavier, which results in limited voltage headroom and considerable capacitive loading. Moreover, due to the parallel connection between two sets of amplifiers and the impedance components connected to either side of one of the amplifiers, overall swing of the output signal is limited.

In the method described in U.S. Pat. No. 6,670,847, inductance is used to cancel the capacitance and increase the bandwidth. One major defect of this method is that the inductor occupies an area far greater than that of the transistor. Another defect of this method is that controlling the characteristic of the inductor remains difficult at the present technological level so that using an inductor requires a longer developing time and a higher production cost.

SUMMARY OF THE INVENTION

Accordingly, at least one objective of the present invention is to provide an apparatus for amplifying differential signals that uses a method different from the prior technique to increase the bandwidth, thereby avoiding the defects in the prior techniques.

To achieve these and other advantages and in accordance with the purpose of the present invention, as embodied and broadly described herein, the present invention provides an apparatus for amplifying differential signals. The apparatus comprises a differential amplifier, a first impedance component, a second impedance component, a voltage source and a high-pass filter. The differential amplifier receives an input differential signal with a first terminal and a second terminal. The differential amplifier also drains currents from the voltage source into a third terminal and a fourth terminal via the first and the second impedance components respectively. The currents drawn by the third and the fourth terminals are GM times as large as the voltages received by the first and the second terminals respectively. Here, GM is the trans-conductance gain of the differential amplifier. The high-pass filter receives the input differential signal and outputs a control differential signal to control the first and the second impedance components so that the impedance of the first and the second impedance components vary inversely in response to the voltages at the first and the second terminals respectively when the state of the input differential signal changes.

In one embodiment of the foregoing apparatus for amplifying differential signals, the first impedance component and the second impedance component are P-channel metal-oxide-semiconductor field effect transistors (PMOS transistors). Therefore, when the state of the input differential signal changes, the control differential signal to the first and the second impedance components vary inversely in response to the voltages at the first terminal and the second terminal respectively.

In one embodiment of the foregoing apparatus for amplifying differential signal, the high-pass filter is an active high-pass filter.

In one preferred embodiment of the present invention, the control differential signal are output from the high-pass filter so that the impedance of the first and the second impedance components vary according to state change in the input differential signal. Hence, the differential signal at the third and the fourth terminals of the differential amplifier can change quickly in response to the input differential signal so that the bandwidth of the apparatus for amplifying differential signals is increased. In other words, the present invention uses an innovative method that differs from the conventional techniques of adding a zero point, connecting amplifiers in parallel or installing an inductor. As a result, many of the defects found in the conventional methods are avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
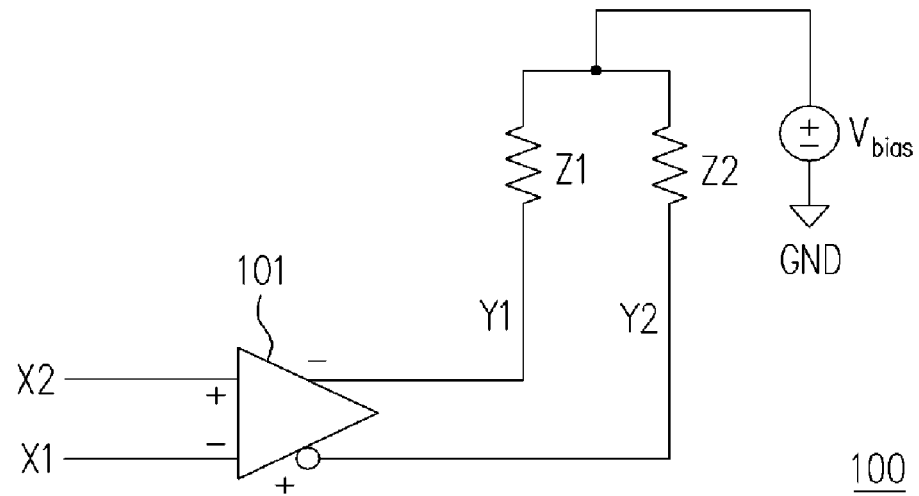
FIG. 1 is a circuit diagram of a conventional apparatus for amplifying differential signals.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a circuit diagram of a conventional apparatus for amplifying differential signals. The differential signal amplifying apparatus 100 includes a differential amplifier 101, impedance components Z1, Z2 and a voltage source Vbias. The differential amplifier 101 receives input differential signal X1, X2 with a first terminal and a second terminal. The differential amplifier 101 also drains a current from the voltage source Vbias into a third terminal (Y1 terminal) via the first impedance component and drains a current from the voltage source Vbias into a fourth terminal (Y2 terminal) via the second impedance component. The current drawn by the Y1 terminal is GM times as large as the voltage received by the X1 terminal and the current drawn by the Y2 is similarly GM times as large as the voltage received by the X2 terminal. Here, GM is the trans-conductance gain of the differential amplifier 101. The input voltage Vin of the differential signal amplifying apparatus 100 is X1−X2 (Vin=X1−X2) and the output voltage Vout is Y2−Y1 (Vout=Y2−Y1). If the impedance value of the impedance components Z1 and Z2 is Z, then, Vout=GM*Z*Vin, wherein GM*Z is the gain of the differential signal amplifying apparatus 100.

Figure 2:
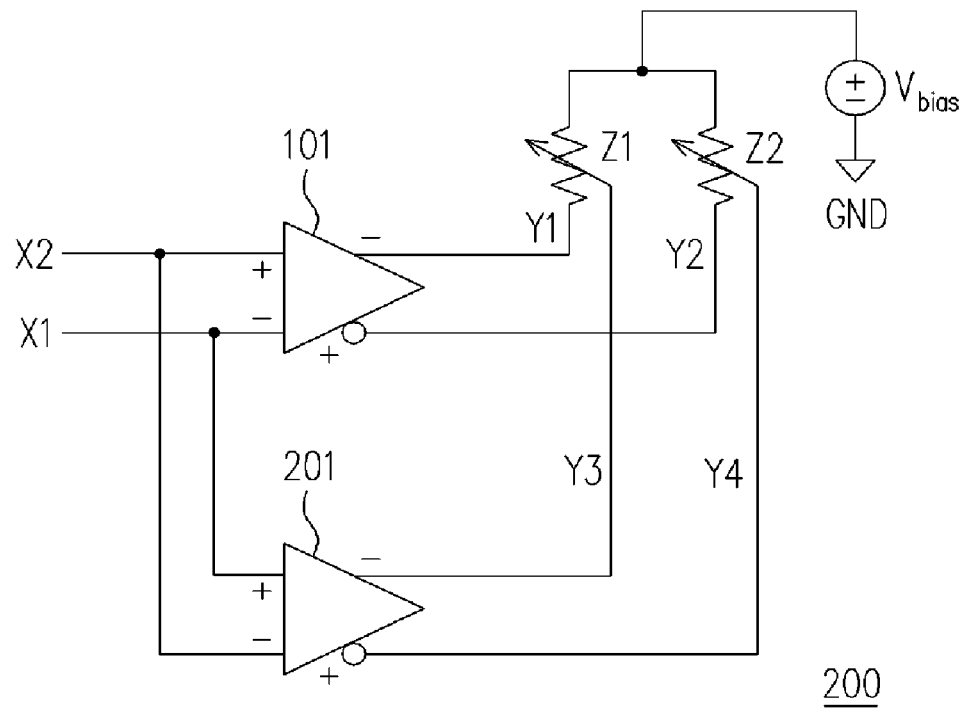
FIGS. 2 and 3 are circuit diagrams of differential signal amplifying apparatus according to an embodiment of the present invention.

In the present invention, the bandwidth is increased by adjusting the impedance of the impedance components Z1 and Z2 as shown in FIG. 2. FIG. 2 is a circuit diagram of a differential signal amplifying apparatus according to an embodiment of the present invention. The main difference between the differential signal amplifying apparatus 200 and that of the differential signal amplifying apparatus 100 is the addition of a high-pass filter 201. The high-pass filter 201 receives the input differential signal X1 and X2 and outputs control differential signal Y3 and Y4. The control differential signal Y3 controls the impedance of the impedance component Z1 so that the impedance of the impedance component Z1 varies inversely in response to the voltage at X1 when the state of the input differential signal X1 changes. On the other hand, the control differential signal Y4 controls the impedance of the impedance component Z2 so that the impedance of the impedance component Z2 varies inversely in response to the voltage at X2 when state of the input differential signal X2 changes.

In the present embodiment, the differential signal X1 and X2 are digital signals, the so-called 'change of state' is a change from a logic '0' to a logic '1' level or a change from a logic '1' to a logic '0' level. Therefore, the so-called 'inverse variation', using X1 and Z1 as an example, means that the impedance of the impedance component Z1 drops when the voltage at X1 increases and the impedance of the impedance component Z1 increases when the voltage at X1 drops. There is also a similar relation between the change of the impedance of the impedance component Z2 and the voltage at X2. The reason that such an inverse relation is able to increase the bandwidth of the differential signal amplifying apparatus 200 is explained in more detail below.

In the present embodiment, the impedance components Z1 and Z2 have the same impedance value to avoid any offset in the output differential signal Y1 and Y2. In other embodiments, if offset is not a major issue, there is no need for the impedance of the impedance components Z1 and Z2 to be identical.

Although the input differential signal X1 and X2 in the present embodiment are digital signals, the scope of application in the present invention is not limited to the reception of digital signals.

Figure 3:
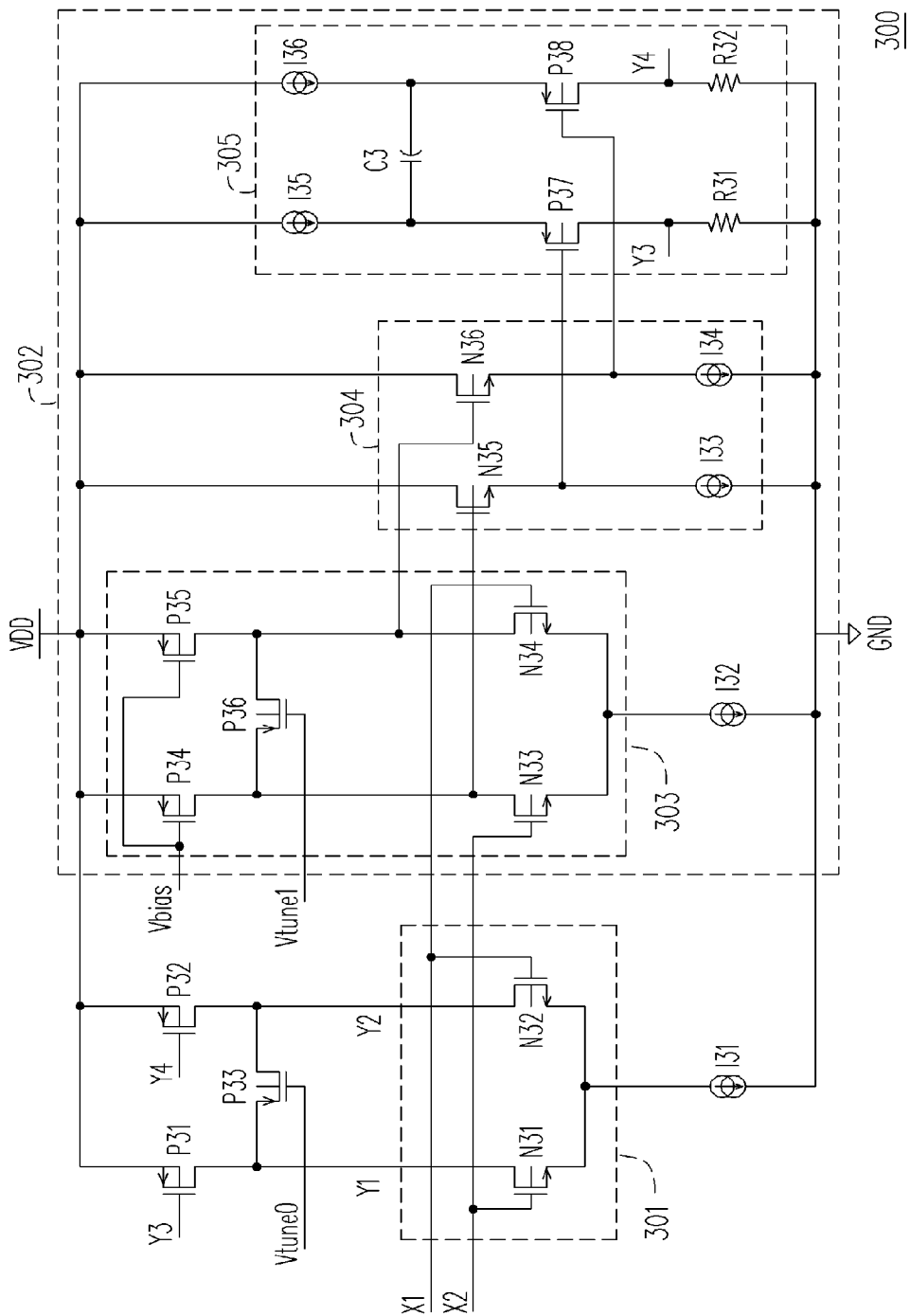

The high-pass filter 201 in FIG. 2 can be implemented using any one of the known circuit designs, for example, the one shown in FIG. 3. FIG. 3 is a circuit diagram of a differential signal amplifying apparatus according to another embodiment of the present invention. In FIG. 3, the PMOS transistors P31 and P32 is equivalent to the impedance components Z1, Z2 in FIG. 2, the differential amplifier 301 is equivalent to the differential amplifier 110 in FIG. 2, and the high-pass filter 302 is equivalent to the high-pass filter 201 in FIG. 2. The high-pass filter 302 is actually an active high-pass filter. That is, besides acting as a filter, the high-pass filter 302 also includes a signal amplifying function.

As shown in FIG. 3, the differential amplifier 301 includes a first N-channel metal-oxide-semiconductor field effect transistor (NMOS transistor) N31 and a second N-channel NMOS transistor N32. The active high-pass filter 302 includes a pre-amplifier 303, a level-shift circuit 304 and a filter amplifier 305. The pre-amplifier 303 amplifies the input differential signal X1 and X2 and outputs the amplified signals. The level-shift circuit 304 receives the voltage signal output from the pre-amplifier 303 and then outputs the shifted signal. The level-shift circuit 304 shifts the DC common-mode voltage without degrading small-signal amplitude from the pre-amplifier 303. The capacitor C3 in the filter amplifier 305 conducts at a high frequency so that the PMOS transistors P37 and P38 are connected as an amplifier. Therefore, the filter amplifier 305 amplifies the output signal from the level-shift circuit 304 and outputs the high frequency portion of the amplified signal to serve as the control differential signal Y3 and Y4. The signals Vtune0 and Vtune1 can be used to control the gain ratio of the high frequency and the intermediate frequency.

Figure 4:
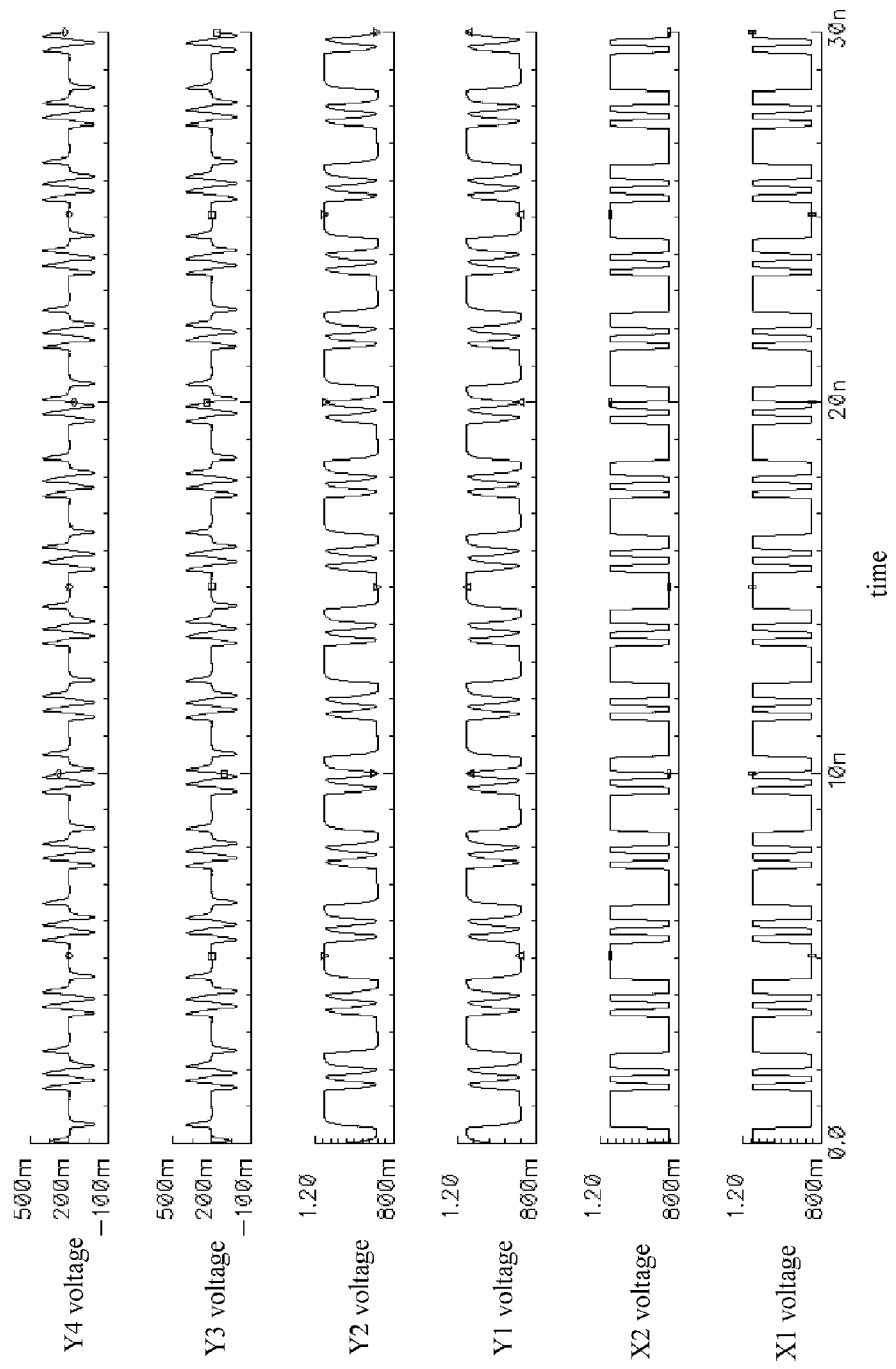
FIG. 4 shows a series of timing diagrams of the signals of a differential signal amplifying apparatus according to an embodiment of the present invention.

FIG. 4 shows a series of timing diagrams of the signals of a differential signal amplifying apparatus according to an embodiment of the present invention. In FIG. 4, the vertical axis is voltage whose unit is voltage (V) and the horizontal axis is time whose unit is second. As shown in FIG. 4, the output differential signal Y1 and the input differential signal X1 have the same phase and the output differential signal Y2 and the input differential signal X2 have the same phase. When the input differential signal X1 increases, the control differential signal Y3 decreases. When the input differential signal X1 decreases, the control differential signal Y3 increases. In the other period, the control differential signal Y3 is maintained in an average level. Therefore, when the input differential signal X1 increases, the corresponding output differential signal Y2 also increases. The decreasing control differential signal Y3 will reduce the impedance of the PMOS transistor P31 spontaneously so that the output differential signal Y1 can rise quickly. Conversely, when the input differential signal X1 decreases, the corresponding output differential signal Y1 also decreases. The increasing control differential signal Y3 will increase the impedance of the PMOS transistor P31 spontaneously so that the output differential signal Y1 can drop quickly. The relationship between the X2, Y2, Y4 and the PMOS transistor P32 is also similar. The present embodiment uses the foregoing method to adjust the impedance value of the PMOS transistors P31 and P32 so that the output differential signal Y1 and Y2 can rapidly respond to the change in the input differential signal X1 and X2. As a result, the gain at high frequency and the usable bandwidth of the differential signal amplifying apparatus 30 are increased.

Figure 5A:
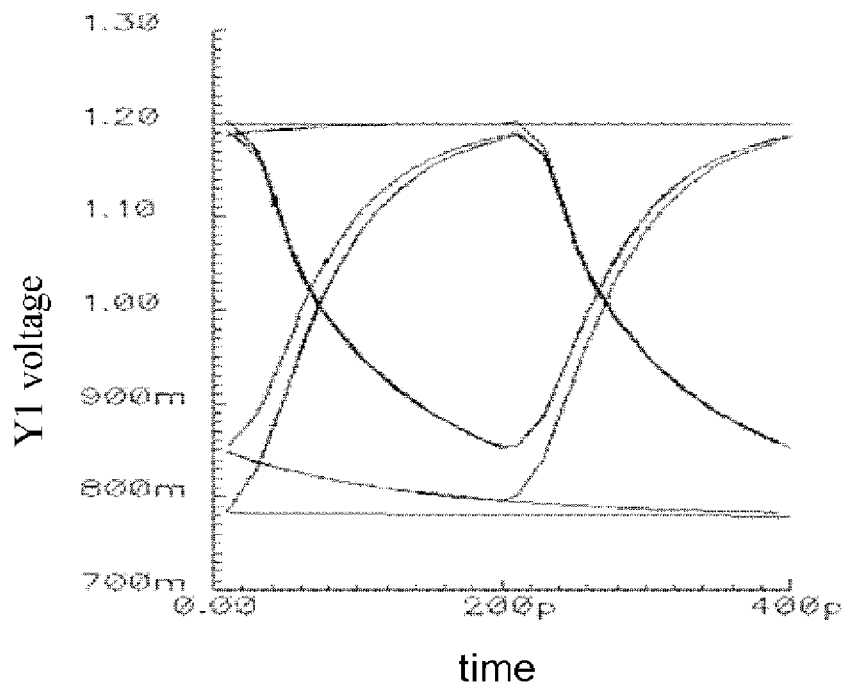
FIGS. 5A and 5B are eye diagrams of a differential signal amplifying apparatus according to an embodiment of the present invention.
Figure 5B:
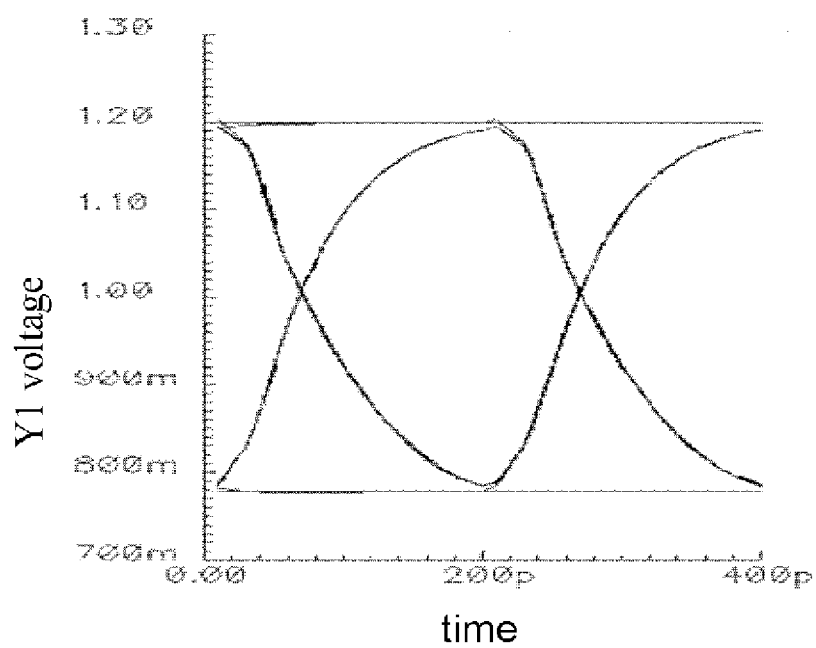

FIG. 5A is an eye diagram of the output differential signal Y1 of the differential signal amplifying apparatus in FIG. 1. FIG. 5B is an eye diagram of the output differential signal Y1 of the differential signal amplifying apparatus in FIG. 3 according to the embodiment of the present invention. The vertical axis is the voltage whose unit is volt (V) and the horizontal axis is time whose unit is picosecond. As shown in FIG. 5B, the signal-related pattern-dependent jitter in the present invention is significantly reduced and the eye-opening degree is clearly increased. Moreover, the output differential signal Y2 also has similar improvements.

Figure 6:
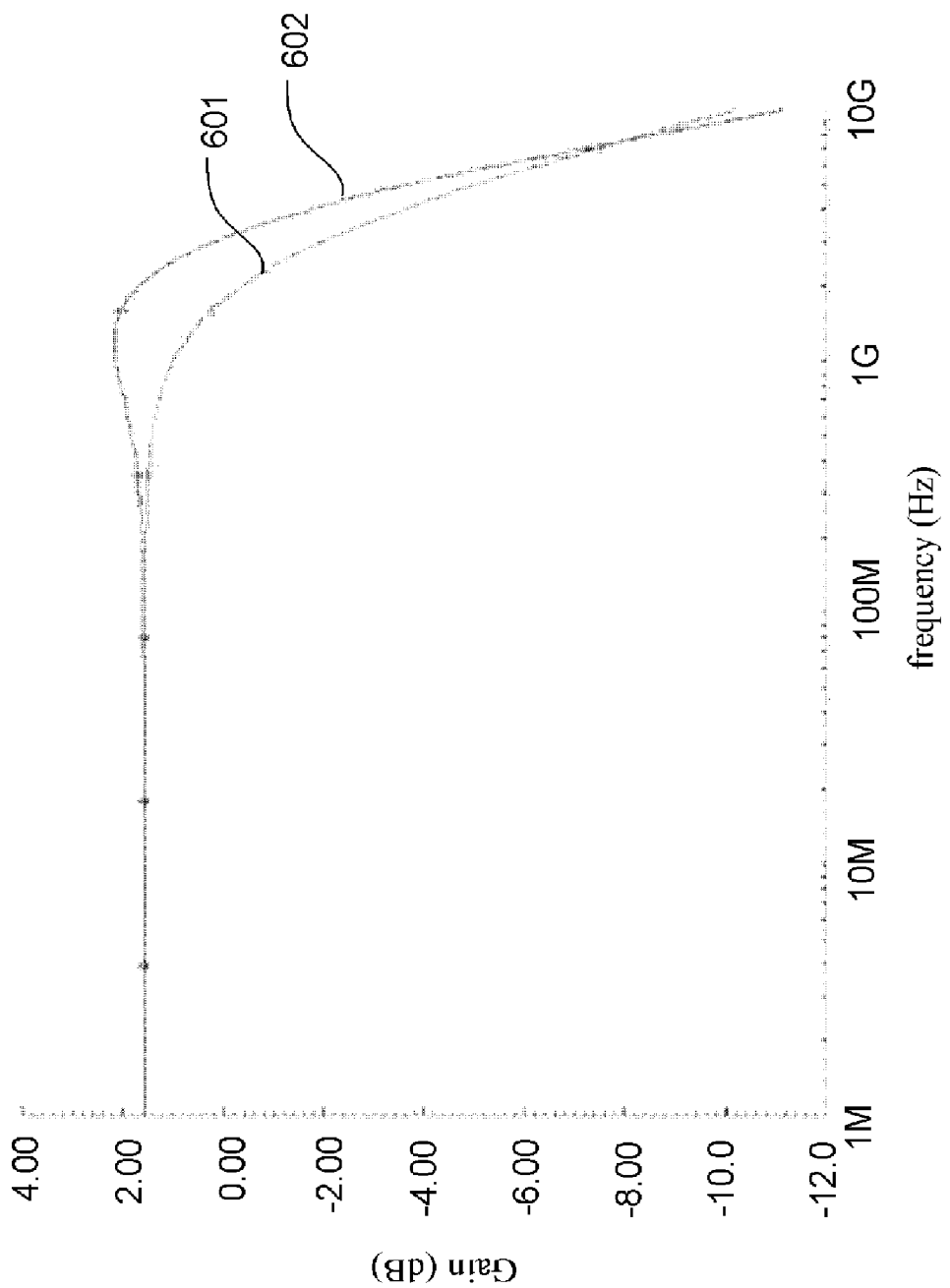
FIG. 6 is a graph showing the simulated result of the gain of a differential signal amplifying apparatus both before and after introducing the improvements according to an embodiment of the present invention.

FIG. 6 is a graph showing the simulated result of the gain of the differential signal amplifying apparatus 100 and 300, that is, before and after introducing the improvements according to the present invention. The horizontal axis is time and the vertical axis is the decibel (dB) value, in other words, the decibel value of (|Y1−Y2|/|X1−X2|), where | | is the operation of taking the absolute value. The curve 601 is the gain-to-frequency curve of the conventional differential signal amplifying apparatus 100 prior to any improvement while the curve 602 is the gain-to-frequency curve of the differential signal amplifying apparatus 300 after introducing the improvements of the present invention. As shown by the curves, the differential signal amplifying apparatus 300 in the present embodiment has a better high frequency gain and a wider usable bandwidth.

The high-pass filter in the present invention is not limited to the design shown in FIG. 3. In other embodiments, various known designs and variations may be used according to the actual demand of a particular application. For example, if there is no particular need to amplify the signals, a general-purpose high-pass filter instead of an active high-pass filter can be used.

Aside from a PMOS transistor, the present invention may deploy various known impedance components as long as their impedance value can be adjusted using a signal. In general, different types of impedance components will have different corresponding relations between the control differential signal Y3, Y4 and the input differential signal X1, X2. With the signals Y3 and X1 as an example and the PMOS transistor in the foregoing embodiment as the impedance component, the signal Y1 will increase in response to an increase in the signal X1. The impedance of the PMOS transistor P31 must be reduced and hence the signal Y3 must be decreased to reduce the impedance of the PMOS transistor P31. In other words, the signal Y3 must vary inversely in response to the signal X1. If another type of impedance component is used, with the impedance component having the characteristic that the impedance is reduced when the control signal is increased, the signal Y3 must vary in phase with the signal X1. Thus, due to the difference in the characteristic of the impedance component in other embodiments, the control differential signal Y3, Y4 may have to vary in phase rather than out of phase in response to the input differential signal X1, X2 when the state of the input differential signal X1, X2 changes. This makes the impedance of the impedance components Z1 and Z2 vary inversely with the input differential signal X1 and X2 to achieve the aim of an increased bandwidth.

Similarly, in a different embodiment of the present invention, the control differential signal Y3, Y4 may have a different phase relation with the input differential signal X1, X2, that is, in phase variation and out of phase variation. In general, a number component circuits, for example, the circuits 303, 304, 305 as shown in FIG. 3, lies between the input differential signal X1, X2 and the generation of the output differential signal Y3, Y4. In order to achieve the required in phase or out of phase variation of the control differential signal Y3 and Y4, the positive and negative connecting relations between the component circuits can be adjusted. Alternatively, the input terminals for the input differential signal X1 and X2 can be exchanged or the output terminals for the output differential signal Y3 and Y4 can be exchanged.

In one preferred embodiment of the present invention, control differential signal Y3, Y4 are output from a high-pass filter so that the impedance of the impedance components Z1, Z2 vary according to the change in the input differential signal X1, X2. Hence, the output differential signal Y1, Y2 can change quickly in response to the input differential signal X1, X2 so that the bandwidth of the apparatus for amplifying differential signals is increased. Hence, the present invention uses an innovative method that differs from the conventional techniques of adding a zero point, connecting amplifiers in parallel or installing an inductor so that many of the defects found in the conventional methods are avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A differential signal amplifying apparatus, comprising:
a differential amplifier;
a first impedance component;
a second impedance component;
a voltage source; and
a high-pass filter, wherein,
the differential amplifier receives an input differential signal with a first terminal and a second terminal, the differential amplifier also drains currents from the voltage source into a third terminal and a fourth terminal via the first and the second impedance components respectively, currents drawn by the third and the fourth terminals are GM times as large as voltages received by the first and the second terminals respectively, and GM is a trans-conductance gain of the differential amplifier; and
the high-pass filter receives the input differential signal and outputs a control differential signal to control the first and the second impedance components so that impedances of the first and the second impedance components vary inversely in response to the voltages at the first and second terminals respectively when a state of the input differential signal changes.

2. The differential signal amplifying apparatus of claim 1, wherein the input differential signal is a digital signal.

3. The differential signal amplifying apparatus of claim 1, wherein the impedance values of the first impedance component and the second impedance component are identical.

4. The differential signal amplifying apparatus of claim 1, wherein the first impedance component and the second impedance component are P-channel metal-oxide-semiconductor field effect transistors.

5. The differential signal amplifying apparatus of claim 4, wherein, when the state of the input differential signal changes, the control differential signal to the first and the second impedance components varies inversely in response to the voltages at the first terminal and the second terminal.

6. The differential signal amplifying apparatus of claim 1, wherein the high-pass filter comprises an active high-pass filter.

7. The differential signal amplifying apparatus of claim 6, wherein the high-pass filter comprises:
 a pre-amplifier for amplifying the input differential signal and outputting an amplified signal;
 a level-shift circuit for shifting the voltage of the output signal of the pre-amplifier and then outputting the shifted voltage; and
 a filter amplifier for amplifying the output signal of the level-shift circuit and outputting the high frequency portion of the amplified signal to serve as the control differential signal.

* * * * *